United States Patent
Hagihara

(10) Patent No.: US 8,994,575 B2
(45) Date of Patent: Mar. 31, 2015

(54) TIME DETECTION CIRCUIT, AD CONVERTER, AND SOLID STATE IMAGE PICKUP DEVICE

(71) Applicant: Olympus Corporation, Tokyo (JP)

(72) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 143 days.

(21) Appl. No.: 13/759,383

(22) Filed: Feb. 5, 2013

(65) Prior Publication Data

US 2013/0146751 A1 Jun. 13, 2013

Related U.S. Application Data

(63) Continuation of application No. PCT/JP2011/062519, filed on May 31, 2011.

(30) Foreign Application Priority Data

Aug. 6, 2010 (JP) ................................ 2010-177756

(51) Int. Cl.
*H03M 1/56* (2006.01)
*H03K 21/00* (2006.01)
*G04F 10/00* (2006.01)
(Continued)

(52) U.S. Cl.
CPC .............. *H03K 21/00* (2013.01); *G04F 10/005* (2013.01); *H03M 1/56* (2013.01); *H04N 5/3742* (2013.01); *H04N 5/378* (2013.01); *H01L 27/14601* (2013.01); *H03M 1/34* (2013.01)
USPC .......................................... 341/169; 341/155

(58) Field of Classification Search
USPC ......................... 341/155, 163, 166, 169, 164
See application file for complete search history.

(56) References Cited

U.S. PATENT DOCUMENTS 6,850,178 B2 * 2/2005 Watanabe ..................... 341/155
8,284,092 B2 * 10/2012 Koyama et al. ............... 341/166
(Continued)

FOREIGN PATENT DOCUMENTS

JP 2009-38726 A 2/2009
JP 2009-38781 A 2/2009
(Continued)

OTHER PUBLICATIONS

Japanese Notice of Allowance dated Apr. 1, 2014, issued in corresponding Japanese application No. 2010-177756, w/ English translation (6 pages).
(Continued)

*Primary Examiner* — Brian Young
(74) *Attorney, Agent, or Firm* — Westerman, Hattori, Daniels & Adrian, LLP

(57) ABSTRACT

A time detection circuit may include: a delay unit configured to have a plurality of delay units, each of which delays and outputs an input signal, and start an operation at a first timing relating to an input of a first pulse; a latch unit configured to latch logic states of the plurality of delay units; a count unit configured to perform a count operation based on a clock output from one of the plurality of delay units; a count latch unit configured to latch a state of the count unit; and a latch control unit configured to enable the latch unit at a second timing relating to an input of a second pulse and cause the latch unit and the count latch unit to execute a latch at a third timing at which a predetermined time has elapsed from the second timing.

17 Claims, 9 Drawing Sheets

(51) Int. Cl.
*H04N 5/374* (2011.01)
*H04N 5/378* (2011.01)
*H01L 27/146* (2006.01)
*H03M 1/34* (2006.01)

(56) References Cited

U.S. PATENT DOCUMENTS 8,344,918 B2 * 1/2013 Baudin et al. ............... 341/115
8,471,736 B1 * 6/2013 Booth et al. ................. 341/115
8,587,689 B2 * 11/2013 Hagihara .................. 348/222.1

FOREIGN PATENT DOCUMENTS

JP 2010-041460 A 2/2010
JP 2010-50529 A 3/2010

OTHER PUBLICATIONS

International Search Report for PCT/JP2011/062519, mailing date of Jul. 5, 2011.

* cited by examiner

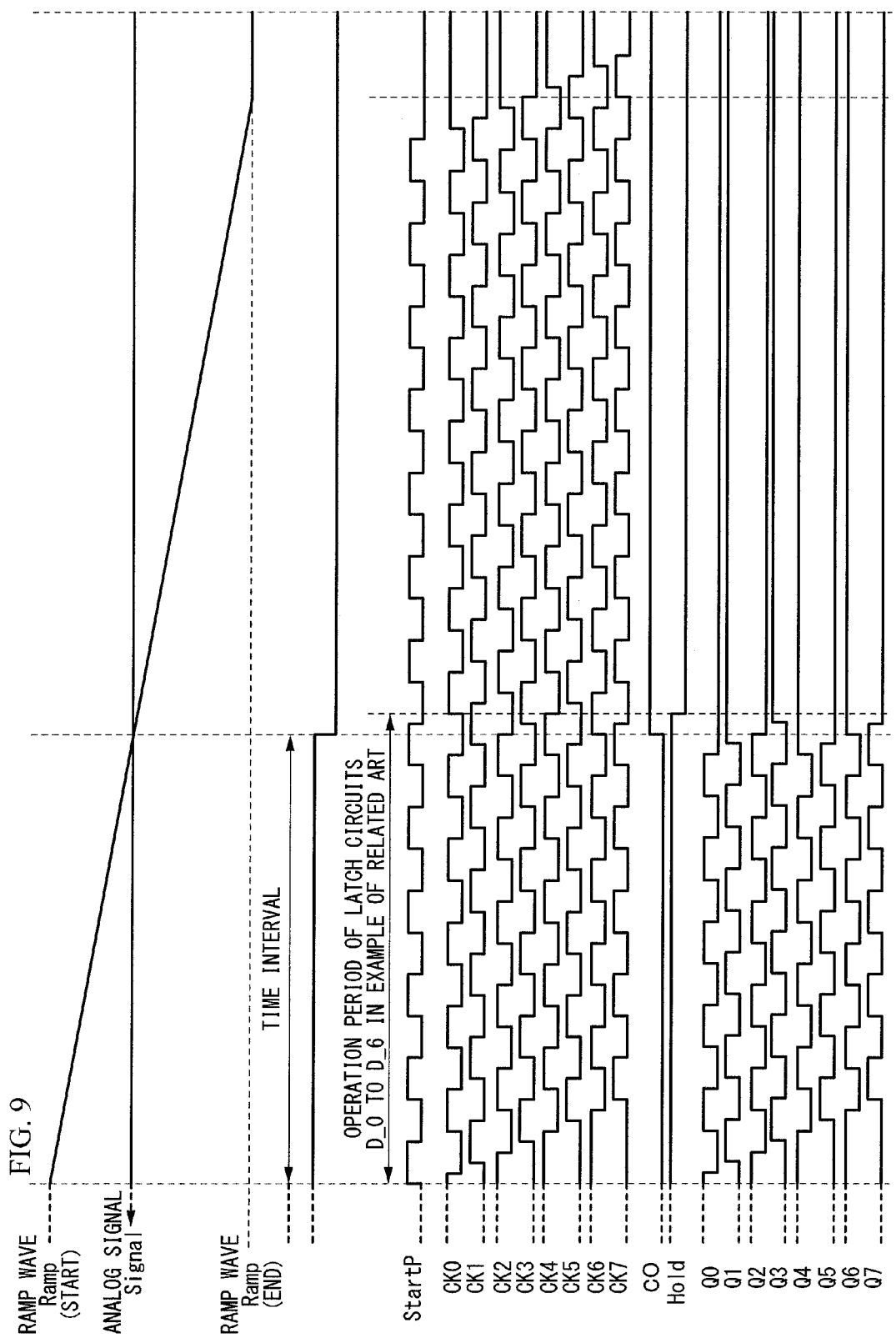

TIME DETECTION CIRCUIT, AD CONVERTER, AND SOLID STATE IMAGE PICKUP DEVICE

CROSS REFERENCE TO RELATED APPLICATIONS

This application is a continuation application based on a PCT Patent Application No. PCT/JP2011/062519, filed May 31, 2011, whose priority is claimed on Japanese Patent Application No. 2010-177756, filed on Aug. 6, 2010, the entire content of which are hereby incorporated by reference.

BACKGROUND OF THE INVENTION

1. Field of the Invention

The present invention relates to a time detection circuit, an analog-to-digital (AD) converter, and a solid state image pickup device.

BACKGROUND ART

2. Description of the Related Art

As an example of a time detection circuit of the related art, a configuration illustrated in FIG. 8 (for example, see Japanese Unexamined Patent Application, First Publication, No. 2009-38726 and Japanese Unexamined Patent Application, First Publication, No. 2009-38781) is well known. First, a configuration and operation of the time detection circuit of FIG. 8 will be described.

FIG. 8 illustrates the time detection circuit in accordance with an example of the related art. The time detection circuit illustrated in FIG. 8 includes a delay unit 30, a comparison unit 31, a latch unit 33, and a count unit 34. The delay unit 30 includes a plurality of delay units DU[0] to DU[7], each of which delays and outputs an input signal. A start pulse (=StartP) is input to the leading delay unit DU[0]. The comparison unit 31 includes a voltage comparator, which receives an analog signal Signal serving as a time detection target and a ramp wave Ramp that decreases with the passage of time and outputs a signal indicating a result obtained by comparing the analog signal Signal with the ramp wave Ramp. The latch unit 33 includes latch circuits D_0 to D_7 that latch logic states of outputs CK0 to CK7 of the delay unit 30. The count unit 34 includes a counter circuit that performs a count operation based on the output CK7 from the delay unit 30.

In the comparison unit 31, a time interval (a magnitude of a time-axis direction) corresponding to an amplitude of the analog signal Signal is generated. A buffer circuit is an inverting buffer circuit that inverts an input signal and outputs the inverted input signal. Here, a configuration of the inverting buffer circuit is provided for a better understanding of the description of the specification.

The latch circuits D_0 to D_7 constituting the latch unit 33 are in an enable (valid) state when an output Hold of the buffer circuit is high, and directly output the outputs CK0 to CK7 of the delay units DU[0] to DU[7]. In addition, the latch circuits D_0 to D_7 are in a disable (invalid) state when the output Hold of the buffer circuit transitions from a high level to a low level. At this time, the latch circuits D_0 to D_7 latch logic states corresponding to the outputs CK0 to CK7 of the delay units DU[0] to DU[7].

A control signal RST is a signal for performing a reset operation of the counter circuit constituting the count unit 34. Further, although a count latch circuit that latches a logic state of a count result of the count unit 34 is not explicitly illustrated, a counter circuit having a latch function is used and hence the counter circuit also includes the count latch circuit.

Next, an operation of the example of the related art will be described. FIG. 9 illustrates the operation of the time detection circuit in accordance with the related art.

First, at a timing (first timing) relating to a comparison start in the comparison unit 31, a clock having a cycle approximately consistent with a delay time of the delay unit 30 is input as the start pulse (=StartP) to the delay unit 30. Thereby, the operation of the delay unit 30 is started. The delay unit DU[0] constituting the delay unit 30 outputs the output CK0 by inverting and delaying the start pulse (=StartP), and the delay units DU[1] to DU[7] constituting the delay unit 30 output the outputs CK1 to CK7 by inverting and delaying the outputs of previous-stage delay units, respectively. The outputs CK0 to CK7 of the delay units DU[0] to DU[7] are input to the latch circuits D_0 to D_7 of the latch unit 33. Because the output Hold of the buffer circuit is high, the latch circuits D_0 to D_7 are in the enable state, and directly output the outputs CK0 to CK7 of the delay units DU[0] to DU[7].

The count unit 34 performs a count operation based on the output CK7 of the delay unit 30 output as an output Q7 of the latch circuit D_7 of the latch unit 33. In this count operation, a count value is increased or decreased by the rising or falling of the output CK7. At a timing (second timing) at which the analog signal Signal is approximately consistent with the ramp wave Ramp, an output CO is inverted. After the output CO of the comparison unit 31 has been buffered by the buffer circuit (a third timing), the output Hold of the buffer circuit becomes low.

Thereby, the latch circuits D_0 to D_7 are in the disable state. At this time, the logic states corresponding to the outputs CK0 to CK7 of the delay units DU[0] to DU[7] are latched in the latch circuits D_0 to D_7.

The latch circuit D_7 is disabled, and hence the count unit 34 latches a count value. Data corresponding to the analog signal Signal is obtained according to the logic state latched by the latch unit 33 and the count value latched by the count unit 34.

According to the time detection circuit in accordance with the above-described example of the related art, it is possible to obtain data corresponding to a time interval. That is, it is possible to detect a time corresponding to the time interval.

It is possible to configure an AD converter that converts an analog signal into a digital signal using the above-described time detection circuit.

In the above-described time detection circuit, the latch circuits D_0 to D_6 constituting the latch unit 33 operate in a period of a time interval. Accordingly, a value of current consumption by the latch unit 33 is increased and it is difficult to reduce current consumption of the time detection circuit.

In the time detection circuit of the example of the related art, the latch circuits D_0 to D_6 constituting the latch unit 33 constantly operate in a period from the first timing to the third timing. Because the outputs CK0 to CK7 of the delay unit 30 generally have a high frequency, it is difficult to implement low current consumption of the time detection circuit itself according to the current consumption by the latch circuits D_0 to D_6 constituting the latch unit 33.

Here, an imager for use in a digital still camera (DSC) or the like is considered as an example of a specific device using the time detection circuit of the example of the related art. Specifically, specs in which the number of pixels is $2000 \times 10^4$ and a frame rate is 60 frames/sec are assumed. Further, the AD converter is arranged for every pixel column. Assuming that a pixel array of $2000 \times 10^4$ pixels is designated as 4000 rows× 5000 columns in length and width for ease of description and a blanking period is absent for further simplicity, the number of lines from which pixel signals are read per second is as follows.

60 frames/sec×4000 rows/frame=240 Klines/sec

That is, a read rate of one row becomes 240 KHz. For example, when AD conversion of 10 bits is configured by seven higher-order bits (a count value of the count unit 34) and three lower-order bits (data of the latch circuits D_0 to D_7 constituting the latch unit 33), the clocks CK0 to CK7 have to be output from the delay unit 30 at about 30 MHz that is greater 128 (=$2^7$) times than the read rate of one row. Here, assuming that a current consumption value per latch circuit constituting the latch unit 33 is 1 μA/piece, a current consumption value in the latch circuits D_0 to D_6 per column becomes 1 μA/piece×7 pieces=7 μA. Further, the output of the latch circuit D_7 is not included in a calculation for use as a count clock of the counter circuit constituting the count unit 34.

That is, a current consumption value of 5000 columns becomes 35 mA. In this calculation, a period in which a comparison operation serving as AD conversion is not performed such as a standby period until the AD converter receives data from a pixel is not considered. In addition, because a period in which a pixel signal is read from an optical black (OB) pixel rather than the above-described pixel or a blanking period is excluded, a frequency may be higher than 30 MHz estimated as described above.

SUMMARY

The present invention provides a time detection circuit, an AD converter, and a solid state image pickup device capable of reducing current consumption.

A time detection circuit in accordance with a preferred embodiment of the present invention may include: a delay unit configured to have a plurality of delay units, each of which delays and outputs an input signal, and start an operation at a first timing relating to an input of a first pulse; a latch unit configured to latch logic states of the plurality of delay units; a count unit configured to perform a count operation based on a clock output from one of the plurality of delay units; a count latch unit configured to latch a state of the count unit; and a latch control unit configured to enable the latch unit at a second timing relating to an input of a second pulse and cause the latch unit and the count latch unit to execute a latch at a third timing at which a predetermined time has elapsed from the second timing.

Preferably, the delay unit is an annular delay circuit in which the plurality of delay units are connected in an annular shape.

Preferably, the time detection circuit may further include: a comparison unit configured to receive an analog signal and a reference signal that increases or decreases with the passage of time and output a comparison signal when the reference signal has satisfied a predetermined condition with respect to the analog signal. The comparison signal may be input to the latch control unit, the first timing may relate to a timing at which the analog signal is input to the comparison unit, and the second timing may relate to a timing at which the comparison signal is input to the latch control unit.

An analog-to-digital (AD) converter in accordance with a preferred embodiment of the present invention may include: the above time detection circuit; a reference signal generation unit configured to generate a reference signal; and a calculation unit configured to generate a digital signal based on logic states latched in a latch unit and a state latched by a count latch unit.

A solid state image pickup device in accordance with a preferred embodiment of the present invention may include: an image capturing unit in which a plurality of pixels, each of which outputs a pixel signal according to an amount of an incident electromagnetic wave, are arranged; and the above AD converter configured to receive an analog signal corresponding to the pixel signal. The comparison unit, the latch unit, the count unit, the count latch unit, and the latch control unit may be provided for every one or more columns of the pixels constituting the image capturing unit.

According to the present invention, current consumption can be reduced because an operation time of a latch unit is shortened by enabling the latch unit at a second timing relating to an input of a second pulse and causing the latch unit and a count latch unit to perform a latch at a third timing at which a predetermined time has elapsed from the second timing.

BRIEF DESCRIPTION OF THE DRAWINGS

FIG. 9 is a timing chart illustrating an operation of the time detection circuit in accordance with the related art.

DESCRIPTION OF THE PREFERRED EMBODIMENTS

Hereinafter, preferred embodiments of the present invention will be described with reference to the drawings.

First Preferred Embodiment

Figure 1:
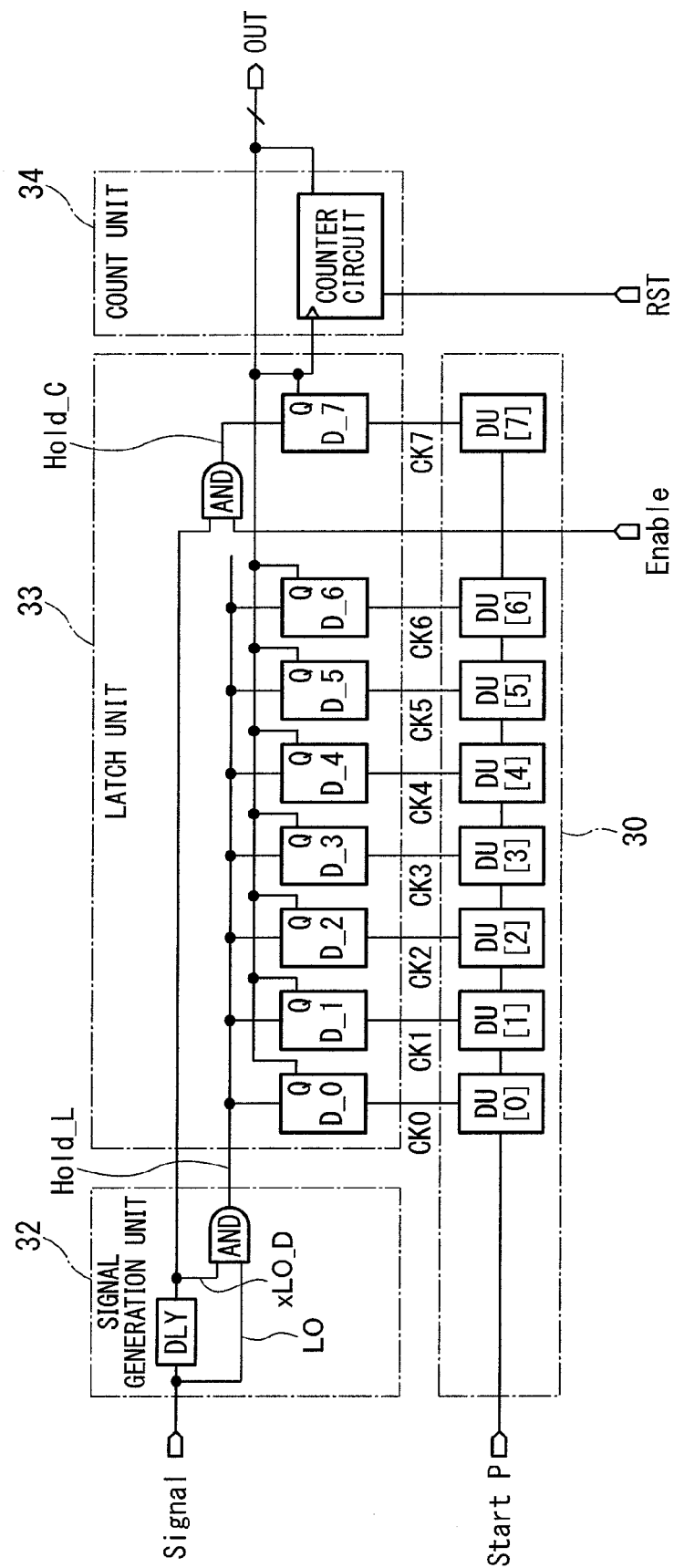
FIG. 1 is a circuit diagram illustrating a configuration of a time detection circuit in accordance with a first preferred embodiment of the present invention.

First, a first preferred embodiment of the present invention will be described. FIG. 1 illustrates an example of a configuration of a time detection circuit in accordance with the first preferred embodiment. Hereinafter, the configuration of this example will be described. The time detection circuit illustrated in FIG. 1 includes a delay unit 30, a signal generation unit 32, a latch unit 33, and a count unit 34.

The delay unit 30 includes a plurality of delay units DU[0] to DU[7], each of which delays an input signal and outputs the delayed signal. A start pulse (=StartP) is input to the leading delay unit DU[0].

The signal generation unit 32 generates a control signal to control operations of the latch unit 33 and the count unit 34. The signal generation unit 32 includes an inverting delay circuit DLY, which inverts and delays an analog signal Signal serving as a time detection target, and an AND circuit, which outputs a signal obtained by performing an AND operation on an input LO (=Signal) of the inverting delay circuit DLY and an output xLO_D of the inverting delay circuit DLY. Details will be described later. According to the above configuration, the signal generation unit 32 generates a control signal for setting latch circuits D_0 to D_6 of the latch unit 33 at a second timing after the start pulse (=StartP) has been input at a first timing to an enable (valid) state and causing the latch circuits D_0 to D_6 and the count unit 34 to execute a latch at a third timing at which a predetermined time has elapsed from the second timing.

The latch unit 33 includes latch circuits D_0 to D_7, which latch logic states of outputs CK0 to CK7 of the delay unit 30. In addition, the latch unit 33 includes an AND circuit, which outputs a signal Hold_C obtained by performing an AND operation on the output xLO_D of the inverting delay circuit DLY of the signal generation unit 32 and a control signal Enable to the latch circuit D_7. The count unit 34 includes a counter circuit that performs a count operation based on the output CK7 from the delay unit 30.

The latch circuits D_0 to D_6 constituting the latch unit 33 are in the enable (valid) state when an output Hold_L of the AND circuit of the signal generation unit 32 is high, and directly output the outputs CK0 to CK6 of the delay units DU[0] to DU[6]. In addition, the latch circuits D_0 to D_6 are in a disable (invalid) state when the output Hold_L of the AND circuit of the signal generation unit 32 transitions from the high level to the low level. At this time, the latch circuits D_0 to D_6 latch the logical states corresponding to the outputs CK0 to CK6 of the delay units DU[0] to DU[6].

On the other hand, the latch circuit D_7 constituting the latch unit 33 is in the enable (valid) state when the output Hold_C of the AND circuit of the latch unit 33 is high, and directly outputs the output CK7 of the delay unit DU[7]. In addition, the latch circuit D_7 is in the disable (invalid) state when the output Hold_C of the AND circuit of latch unit 33 transitions from the high level to the low level. At this time, the latch circuit D_7 latches the logical state corresponding to the output CK7 of the delay unit DU[7].

The control signal Enable is a signal for controlling the AND circuit of the latch unit 33. A control signal RST is a signal for performing a reset operation of the counter circuit constituting the count unit 34. Although a count latch circuit that latches the logic state of a count result of the count unit 34 is not explicitly illustrated in this drawing, a counter circuit having a latch function is used and hence the counter circuit also includes the count latch circuit. Further, this configuration is only an example, and the present invention is not limited thereto.

Figure 2:
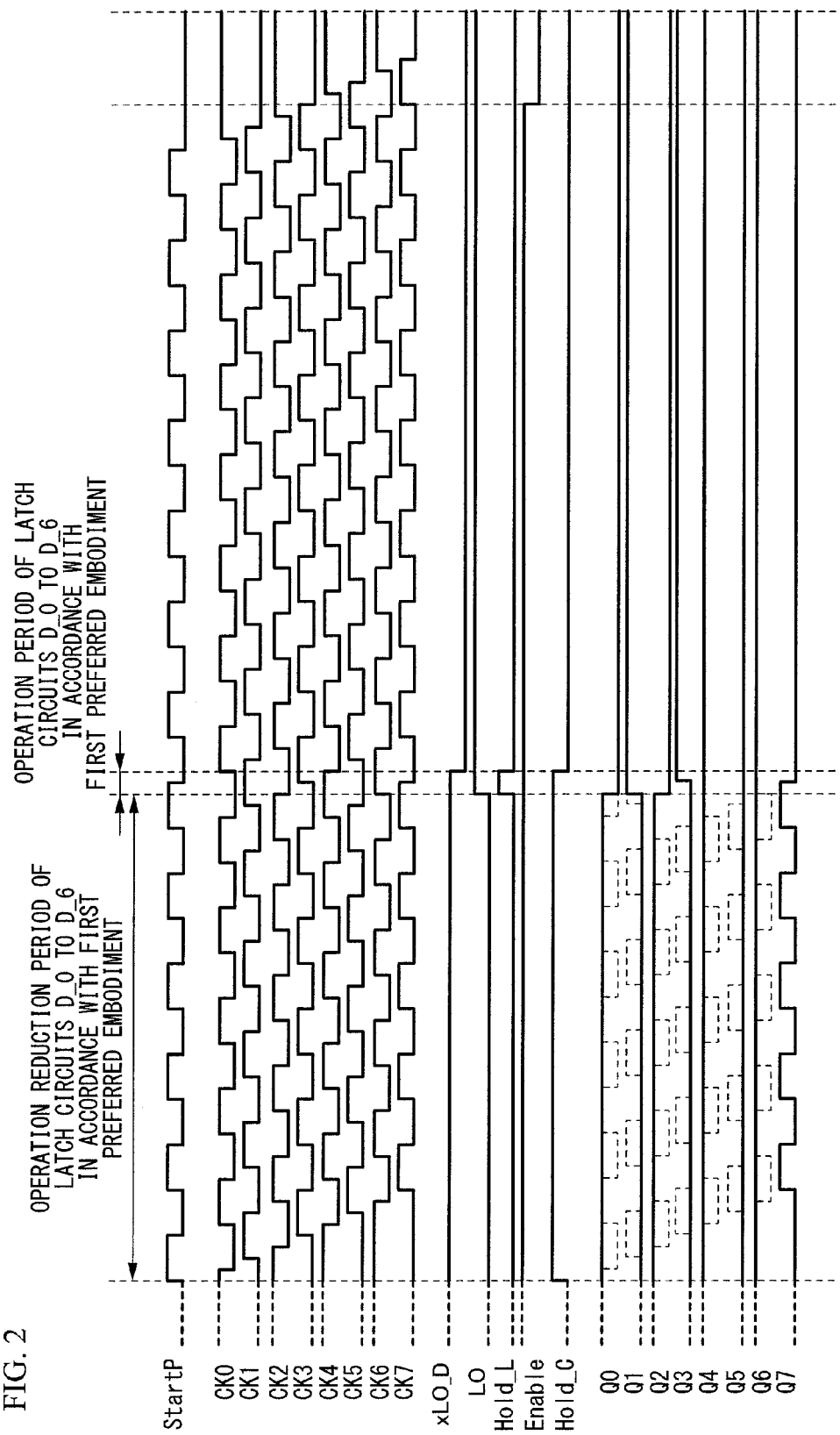
FIG. 2 is a timing chart illustrating an operation of the time detection circuit in accordance with the first preferred embodiment of the present invention.

Next, an operation of this example will be described. FIG. 2 illustrates the operation of the time detection circuit in accordance with the first preferred embodiment of the present invention.

First, a clock of a cycle approximately consistent with a delay time of the delay unit 30 is input as the start pulse (=StartP) (the first timing). Thereby, the operation of the delay unit 30 is started. The delay unit DU[0] constituting the delay unit 30 outputs the output CK0 by inverting and delaying the start pulse (=StartP), and the delay units DU[1] to DU[7] constituting the delay unit 30 output the outputs CK1 to CK7 by inverting and delaying the outputs of previous-stage delay units. The outputs CK0 to CK7 of the delay units DU[0] to DU[7] are input to the latch circuits D_0 to D_7 of the latch unit 33. Because the output Hold_L of the AND circuit of the signal generation unit 32 is low, the latch circuits D_0 to D_6 are disabled in the disable state.

On the other hand, because the output Hold_C of the AND circuit of the latch unit 33 is high, the latch circuit D_7 is in the enable state and directly outputs the output CK7 of the delay unit DU[7]. The count unit 34 performs a count operation based on the output CK7 of the delay unit 30 output as an output Q7 of the latch circuit D_7. In the count operation, a count value is increased or decreased by the rising or falling of the output CK7.

After a "time to be detected" serving as a detection target has elapsed from the first timing, the input LO (=Signal) of the inverting delay circuit DLY of the signal generation unit 32 is inverted and hence the output Hold_L of the AND circuit of the signal generation unit 32 becomes high. Thereby, the latch circuits D_0 to D_6 are in the enable state. After a time consistent with a delay time of the inverting delay circuit DLY of the signal generation unit 32 has elapsed from the second timing (the third timing), the output xLO_D of the inverting delay circuit DLY of the signal generation unit 32 is inverted and the output Hold_L of the AND circuit of the signal generation unit 32 becomes low. Thereby, the latch circuits D_0 to D_6 are in the disable state. At this time, the logic states corresponding to the outputs CK0 to CK6 of the delay units DU[0] to DU[6] are latched in the latch circuits D_0 to D_6 of the latch unit 33.

In addition, because the output Hold_C of the AND circuit of the latch unit 33 becomes low at the above-described third timing, the latch circuit D_7 is in the disable state, and the logic state corresponding to the output CK7 of the delay unit DU[7] is latched in the latch circuit D_7 of the latch unit 33. The latch circuit D_7 is disabled and hence the count unit 34 latches the count value. Data corresponding to the "time to be detected" is obtained according to the logic state latched by the latch unit 33 and the count value latched by the count unit 34. The latched data, for example, is output to a subsequent-stage calculation unit (not illustrated), and a process of binarization or the like is performed.

In the above-described operation, it is possible to reduce current consumption in the latch unit 33 because the latch circuits D_0 to D_6 operate only in a period from the second timing to the third timing. Therefore, it is possible to reduce current consumption of the time detection circuit.

Further, although a configuration implementing low power consumption by controlling operations of the latch circuits D_0 to D_6 constituting the latch unit 33 is made in this example, for example, a configuration in which the latch circuits D_1 to D_5 are controlled may be made. In addition, the present invention is not limited thereto.

Second Preferred Embodiment

Figure 3:
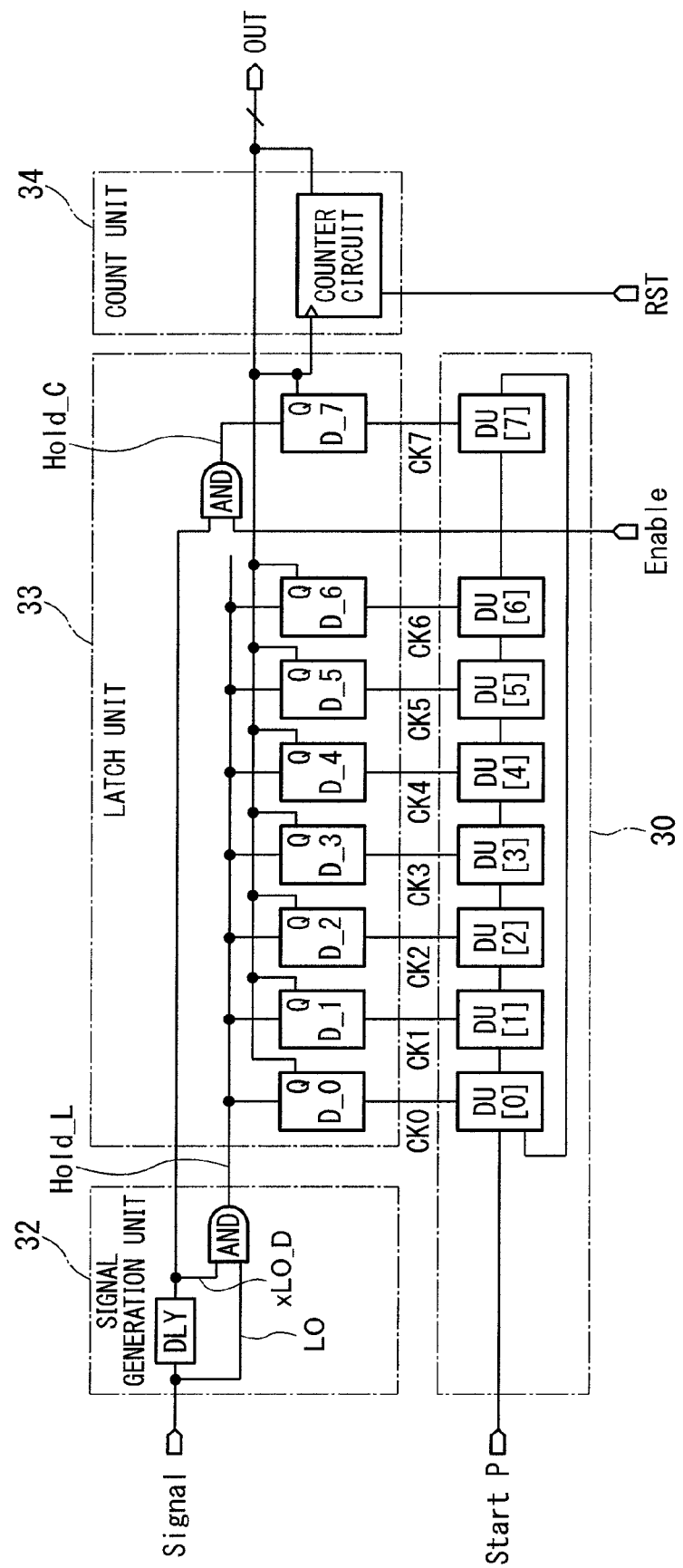
FIG. 3 is a circuit diagram illustrating a configuration of a time detection circuit in accordance with a second preferred embodiment of the present invention.

Next, a second preferred embodiment of the present invention will be described. FIG. 3 illustrates a configuration of a time detection circuit in accordance with the second preferred embodiment of the present invention. Hereinafter, a configuration diagram of this example will be described. A difference from the configuration illustrated in FIG. 1 is a delay unit 30. In the second preferred embodiment, an annular delay circuit is implemented by connecting a plurality of delay units DU[*] (* is 0 to 7) constituting the delay unit 30 in a ring shape. Because other components are substantially the same as in FIG. 1, description thereof is omitted.

Figure 4:
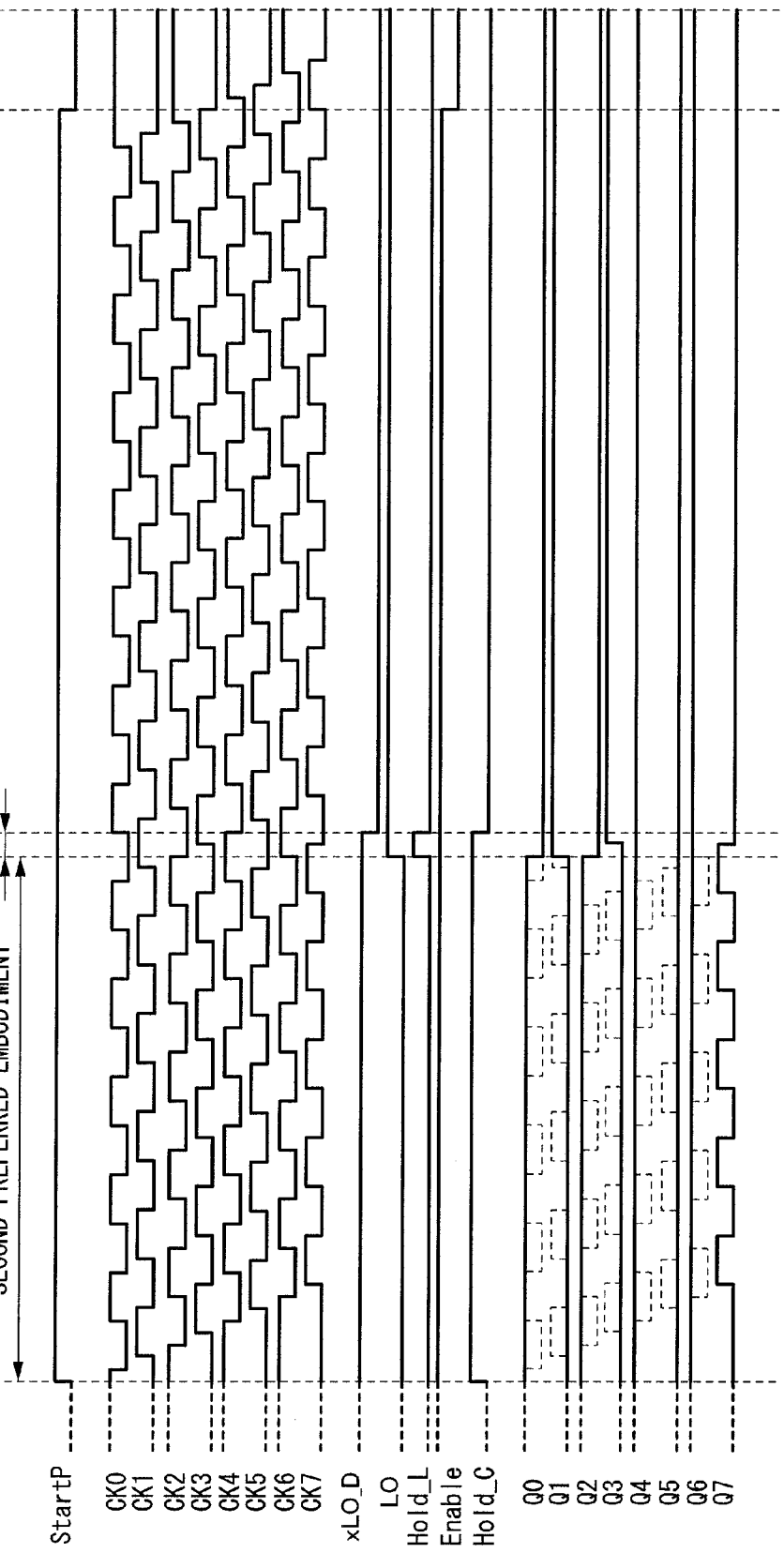
FIG. 4 is a timing chart illustrating an operation of the time detection circuit in accordance with the second preferred embodiment of the present invention.

Next, an operation of this example will be described. FIG. 4 illustrates an operation of the time detection circuit in accordance with the second preferred embodiment. A difference from FIG. 2 is a start pulse (=StartP). The logic state of the start pulse (=StartP) is changed from the low level to the high level, and hence the delay unit 30 starts the operation and a count operation of the count unit 34 is performed based on the output CK7 from the delay unit 30. Because other components are substantially the same as in FIG. 2, description thereof is omitted.

Although it is necessary to generate the start pulse (=StartP) as a synchronization clock approximately consistent with a delay time of the delay unit 30 in the first preferred embodiment, it is easy to generate the start pulse (=StartP) in the second preferred embodiment. Thus, control of the delay unit 30, that is, control of the time detection circuit, is facilitated.

Third Preferred Embodiment

Figure 5:
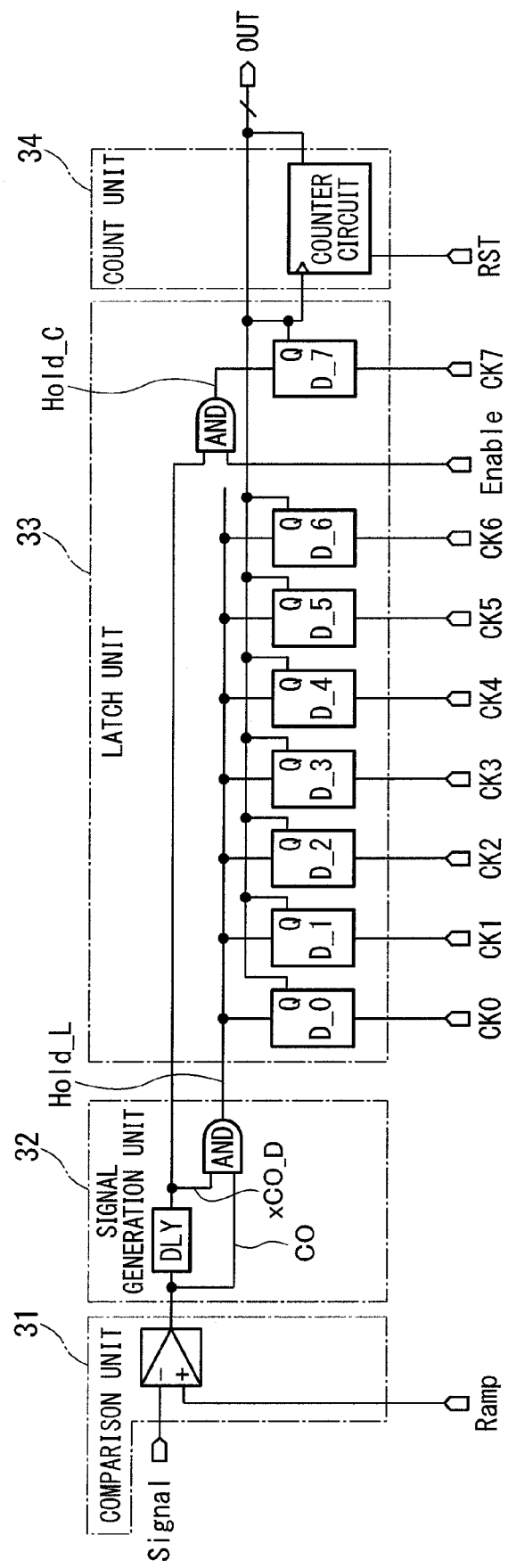
FIG. 5 is a circuit diagram illustrating a configuration of a time detection circuit in accordance with a third preferred embodiment of the present invention.
Figure 6:
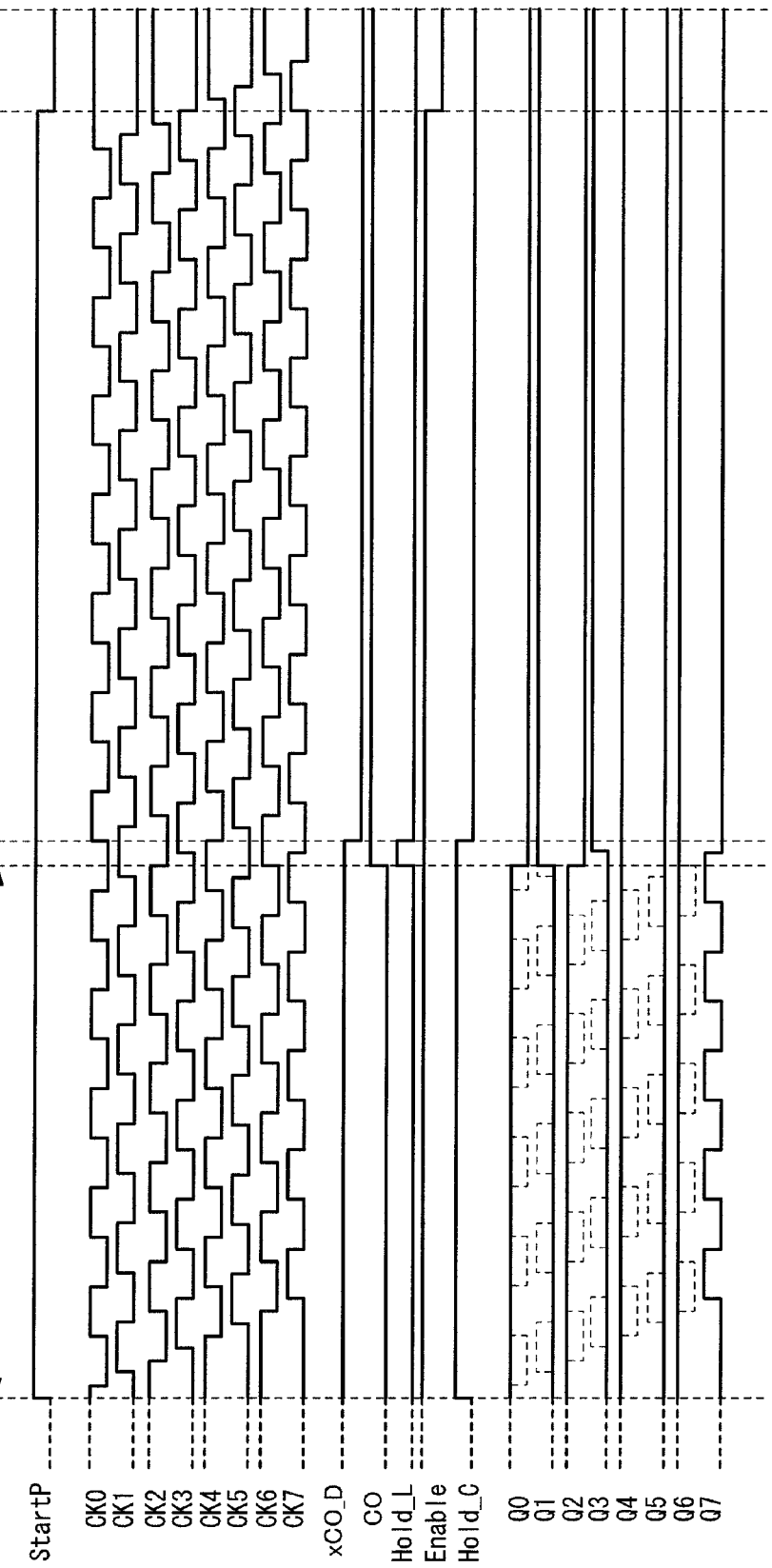
FIG. 6 is a timing chart illustrating an operation of the time detection circuit in accordance with the third preferred embodiment of the present invention.

Next, a third preferred embodiment of the present invention will be described. FIG. 5 illustrates an example of a configuration of a time detection circuit in accordance with the third preferred embodiment of the present invention. Hereinafter, a configuration diagram of this example will be described. The illustration of the delay unit 30 is omitted in FIG. 5. A difference from the configuration illustrated in FIG. 3 is that a comparison unit 31 is added. The comparison unit 31 includes a voltage comparator, which receives an analog signal Signal serving as a time detection target and a ramp wave Ramp that increases or decreases with the passage of time and outputs a signal indicating a result obtained by comparing the analog signal Signal with the ramp wave Ramp. Thereby, a time interval (corresponding to the "time to be detected" in the description of FIG. 2) corresponding to the analog signal Signal is generated. Because other components are substantially the same as in FIG. 3, description thereof is omitted.

Next, an operation of this example will be described. First, at a timing (first timing) relating to a comparison start in the comparison unit 31, the logic state of a start pulse (=StartP) is changed from the low level to the high level.

Thereby, the delay unit 30 starts the operation. The delay unit DU[0] constituting the delay unit 30 outputs the output CK0 by inverting and delaying the start pulse (=StartP), and the delay units DU[1] to DU[7] constituting the delay unit 30 output the outputs CK1 to CK7 by inverting and delaying the outputs of the previous-stage delay units. The outputs CK0 to CK7 of the delay units DU[0] to DU[7] are input to the latch circuits D_0 to D_7 of the latch circuit 33. Because the input CO of the inverting delay circuit DLY is low and the output Hold_L of the AND circuit of the signal generation unit 32 is low, the latch circuits D_0 to D_6 are disabled in the disable state.

On the other hand, because the output Hold_C of the AND circuit of the latch unit 33 is high, the latch circuit D_7 is in the enable state and directly outputs the output CK7 of the delay unit DU[7]. The count unit 34 performs a count operation based on the output CK7 of the delay unit 30 output as the output Q7 of the latch circuit D_7. In the count operation, a count value is increased or decreased by the rising or falling of the output CK7.

At a timing (second timing) at which the analog signal Signal is approximately consistent with the ramp wave Ramp, the output CO of the comparison unit 31 is inverted and becomes high. Thereby, the latch circuits D_0 to D_6 are in the enable state. After a time consistent with a delay time of the inverting delay circuit DLY of the signal generation unit 32 has elapsed from the second timing (a third timing), an output xCO_D of the inverting delay circuit DLY of the signal generation unit 32 is inverted and the output Hold_L of the AND circuit of the signal generation unit 32 becomes low. Thereby, the latch circuits D_0 to D_6 are in the disable state. At this time, the logic states corresponding to the outputs CK0 to CK6 of the delay units DU[0] to DU[6] are latched in the latch circuits D_0 to D_6 of the latch unit 33.

In addition, because the output Hold_C of the AND circuit of the latch unit 33 becomes low at the above-described third timing, the latch circuit D_7 is in the disable state and the logic state corresponding to the output CK7 of the delay unit DU[7] is latched in the latch circuit D_7 of the latch unit 33. The latch circuit D_7 is disabled and hence the count unit 34 latches the count value. According to the logic state latched by the latch unit 33 and the count value latched by the count unit 34, data corresponding to a time interval from the first timing to the second timing is obtained. The latched data, for example, is output to a subsequent-stage calculation unit (not illustrated), and a process of binarization or the like is performed.

In the above-described operation, it is possible to reduce current consumption in the latch unit 33 because the latch circuits D_0 to D_6 operate only in a period from the second timing to the third timing. Therefore, it is possible to reduce current consumption of the time detection circuit.

Further, although a configuration implementing low power consumption by controlling operations of the latch circuits D_0 to D_6 constituting the latch unit 33 is made in this example, for example, a configuration in which the latch circuits D_1 to D_5 are controlled may be made. In addition, the present invention is not limited thereto.

Fourth Preferred Embodiment

Figure 7:
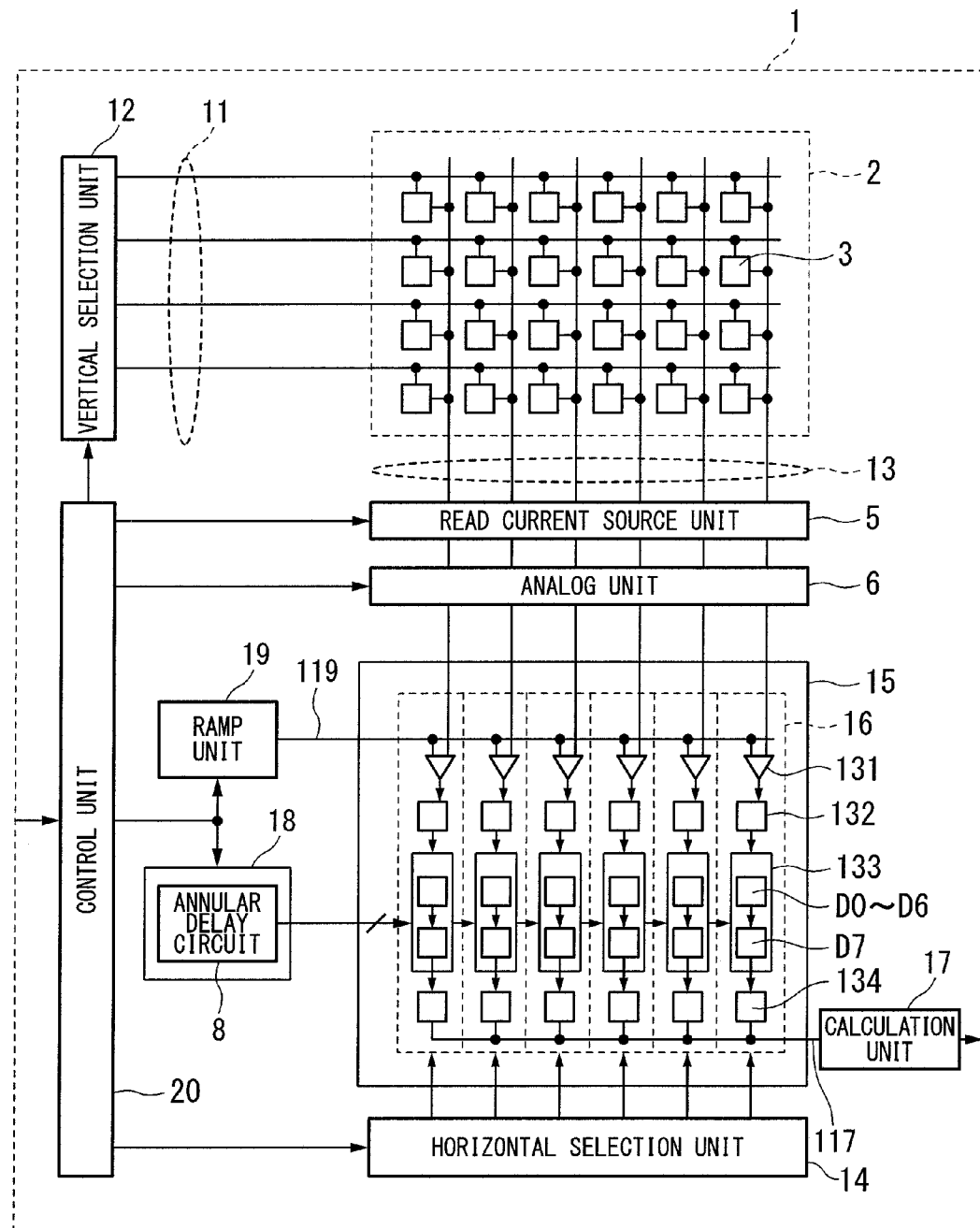
FIG. 7 is a block diagram illustrating a configuration of a solid state image pickup device in accordance with a fourth preferred embodiment of the present invention.
Figure 8:
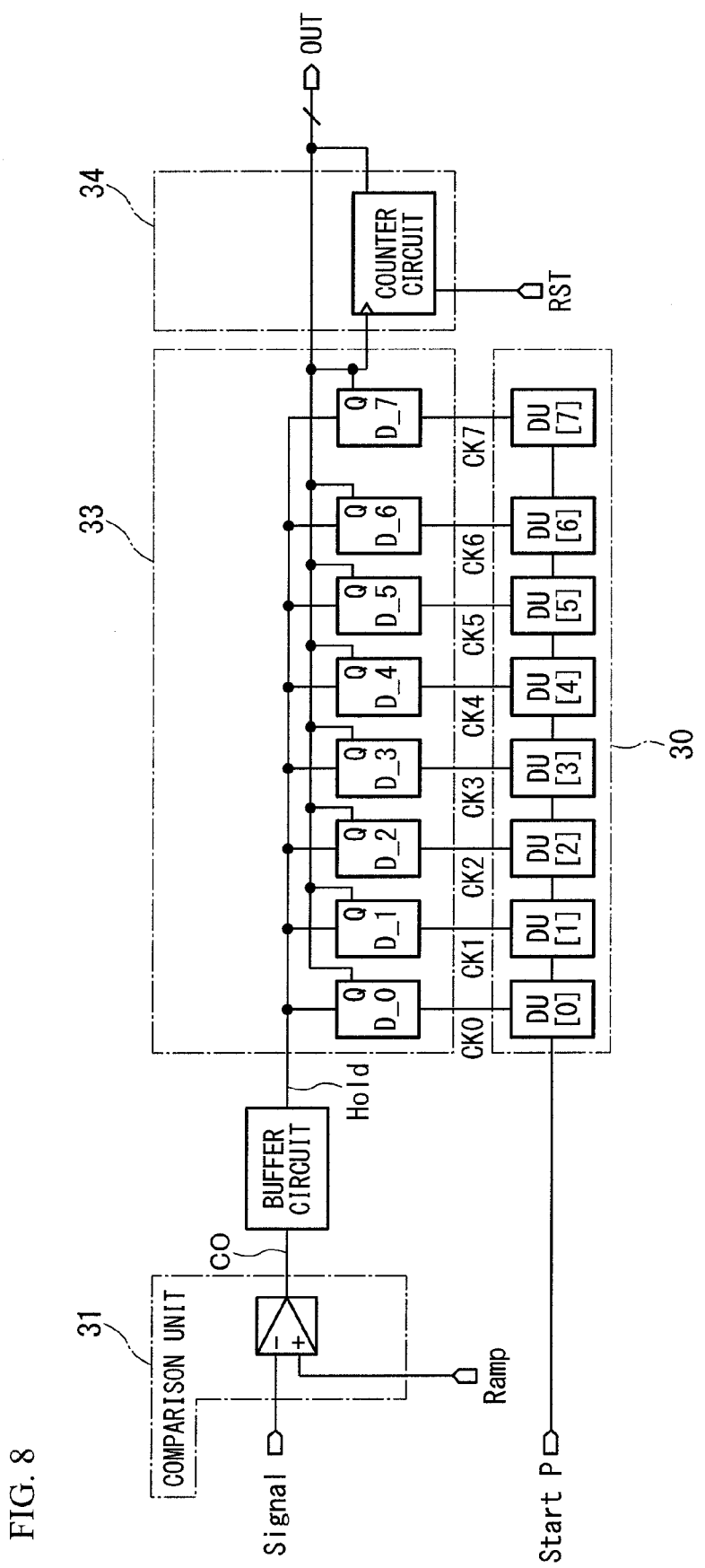
FIG. 8 is a circuit diagram illustrating a configuration of a time detection circuit in accordance with the related art.

Next, a fourth preferred embodiment of the present invention will be described. FIG. 7 illustrates an example of a configuration of a solid state image pickup device in accordance with the fourth preferred embodiment of the present invention. Hereinafter, a configuration diagram of this example will be described. A solid state image pickup device 1 illustrated in FIG. 7 includes an image capturing unit 2, a vertical selection unit 12, a read current source unit 5, an analog unit 6, a delay unit 18, a ramp unit 19, a column processing unit 15, a horizontal selection unit 14, a calculation unit 17, and a control unit 20.

In the image capturing unit 2, a plurality of unit pixels 3, each of which generates and outputs a signal corresponding to an amount of an incident electromagnetic wave, are arranged in a matrix. The vertical selection unit 12 selects each row of the image capturing unit 2. The read current source unit 5 reads a signal from the image capturing unit 2 as a voltage signal. The analog unit 6 performs analog processing on the signal read from the image capturing unit 2. The delay unit 18 corresponds to the delay unit 30 described in the second and third preferred embodiments, and has an annular delay circuit 8. The ramp unit 19 generates a ramp wave as a reference signal that increases or decreases with the passage of time. The column processing unit 15 is connected to the ramp unit 19 via a reference signal line 119. The horizontal selection unit 14 reads data generated by the column processing unit 15 to a horizontal signal line 117. The calculation unit 17 is connected to the horizontal signal line 117. The control unit 20 controls each unit.

Although the image capturing unit 2 including unit pixels 3 of 4 rows×6 columns has been described with reference to FIG. 7 for simplicity, several tens to several tens of thousands of unit pixels 3 are actually arranged in each row or column of the image capturing unit 2. Although not illustrated, the unit pixels 3 constituting the image capturing unit 2 include a photoelectric conversion element such as a photodiode, a photogate, or a phototransistor and a transistor circuit.

In this system configuration, a peripheral driving system and a peripheral signal processing system for controlling driving of each of the unit pixels 3 of the image capturing unit 2, that is, peripheral circuits such as the vertical selection unit 12, the horizontal selection unit 14, the column processing unit 15, the calculation unit 17, the delay unit 18, the ramp unit 19, and the control unit 20, are integrally formed in a semiconductor area such as single crystal silicon or the like along with the image capturing unit 2 using technology similar to technology for manufacturing a semiconductor integrated circuit.

Hereinafter, the units will be described in further detail. In the image capturing unit 2, the unit pixels 3 are two-dimensionally arranged only in 4 rows and 6 columns, and a row control line 11 is wired for every row with respect to a pixel array of 4 rows and 6 columns. One end of the row control line 11 is connected to an output end corresponding to each row of the vertical selection unit 12. The vertical selection unit 12 includes a shift register or a decoder. The vertical selection unit 12 controls row addressing or row scanning of the image capturing unit 2 via the row control line 11 when each unit pixel 3 of the image capturing unit 2 is driven. In addition, a vertical signal line 13 is wired for every column with respect to the pixel array of the image capturing unit 2.

The read current source unit 5, for example, is configured using an n-channel metal-oxide-semiconductor (NMOS) transistor. The vertical signal line 13 from the image capturing unit 2 is connected to a drain terminal. A desired voltage is appropriately applied to a control terminal, and a source terminal is connected to the ground (GND). Thereby, a signal from the unit pixel 3 is output as a voltage mode. Further, although the case in which the NMOS transistor is used as a current source has been described, the present invention is not limited thereto.

Although not described in detail, the analog unit 6 removes a noise component referred to as fixed pattern noise (FPN), which is fixed variation for every pixel, or reset noise by processing a difference between a signal level (reset level) immediately after pixel reset and a true signal level with respect to a pixel signal of the voltage mode input via the vertical signal line 13. Further, if necessary, an auto gain control (AGC) circuit having a signal amplification function or the like may be provided.

The column processing unit 15, for example, has an AD conversion (ADC) unit 16 provided for every pixel column of the image capturing unit 2, that is, every vertical signal line 13. The column processing unit 15 converts an analog pixel signal read from each unit pixel 3 of the image capturing unit 2 through the vertical signal line 13 for every pixel column into digital data. Further, although ADC units 16 are arranged to have a one-to-one correspondence relationship with pixel columns of the image capturing unit 2 in this example, this is only an example and the present invention is not limited to this layout relationship. For example, one ADC unit 16 for a plurality of pixel columns can be arranged and the one ADC unit 16 can be used and configured in time division among the plurality of pixel columns. The column processing unit 15 includes an AD converter for converting an analog pixel signal read from a unit pixel 3 of a selected pixel row of the image capturing unit 2 into digital pixel data along with the ramp unit 19, the delay unit 18, and the calculation unit 17 as will be described later.

The delay unit 18 is not limited to a voltage controlled oscillator (VCO) circuit, which is a symmetric oscillation circuit as an annular delay circuit. Although the annular delay circuit itself includes an odd number of delay units as in the symmetric oscillation circuit, a so-called asymmetric oscillation circuit in which the number of outputs is equivalently an even number (particularly, a power of two) may be used. Further, the annular delay circuit itself may include an even number (particularly, a power of two) of delay units. A ring delay line (RDL) circuit or an annular delay circuit having an even number (particularly, a power of two) of outputs (terminals) of the lower-order logic state may include an even number (particularly, a power of two) of delay units. Further, a so-called fully differential oscillation circuit may be used in which the outputs of the final stage of the fully differential inversion circuit forming the delay unit are returned to the reverse side of the inputs of the initial stage. Further, although the annular delay circuit is suitable for the delay unit 18, the present invention is not limited thereto.

The ramp unit 19, for example, includes an integrating circuit. According to control of the control unit 20, the ramp unit 19 generates a ramp wave, the level of which changes along a gradient with the passage of time, and supplies the ramp wave to one of input terminals of a voltage comparison unit 131 via the reference signal line 119. The ramp unit 19 is not limited to the integrating circuit, and a digital-to-analog conversion (DAC) circuit may be used. However, in the case of a configuration in which a ramp wave is digitally generated using the DAC circuit, a configuration that makes the step of the ramp wave fine or a configuration equivalent thereto is necessary.

The horizontal selection unit 14 includes a shift register, a decoder, or the like. The horizontal selection unit 14 controls column addressing or column scanning of the ADC unit 16 of the column processing unit 15. According to control of the horizontal selection unit 14, digital data subjected to ADC by the ADC unit 16 is sequentially read to the horizontal signal line 117.

The calculation unit 17 performs code conversion such as binarization based on digital data output to the horizontal signal line 117, and outputs binary digital data. In addition, the calculation unit 17 may have embedded signal processing functions, for example, such as black level adjustment, column variation correction, color processing, and the like. Further, n-bit parallel digital data may be converted into serial data and the serial data may be output.

The control unit 20 includes a functional block of a timing generator (TG), which supplies predetermined timing pulse signals or clocks necessary for operations of units such as the ramp unit 19, the delay unit 18, the vertical selection unit 12, the horizontal selection unit 14, and the calculation unit 17, and a functional block for communicating with the TG. Further, the control unit 20 may be provided as another semiconductor integrated circuit so as to be independent of other functional elements such as the image capturing unit 2 or the vertical selection unit 12 and the horizontal selection unit 14. In this case, an image capturing apparatus, which is an example of a semiconductor system, is constructed by the control unit 20 and an image pickup device including the image capturing unit 2 or the vertical selection unit 12, the horizontal selection unit 14, and the like. The image capturing apparatus may be provided as an image capturing module embedded with a peripheral signal process, a power-supply circuit, or the like.

Next, a configuration of the ADC unit 16 will be described. The ADC unit 16 generates a time interval having the magnitude (pulse width) of a time-axis direction corresponding to each magnitude of the pixel signal by comparing an analog pixel signal read from each unit pixel 3 of the image capturing unit 2 via the vertical signal line 13 with a ramp wave for ADC provided from the ramp unit 19. The ADC is performed by designating data corresponding to the time interval as digital data corresponding to the magnitude of a pixel signal.

Hereinafter, details of the configuration of the ADC unit 16 will be described. The ADC unit 16 is provided for every column. In FIG. 7, six ADC units 16 are provided. The ADC units 16 of the columns have the same configuration. The ADC unit 16 includes the voltage comparison unit 131, a latch control unit 132, a latch unit 133, and a column counter 134.

The voltage comparison unit 131, which is an example of a comparison unit, converts the magnitude of the pixel signal into a time interval (pulse width), which is information of the time-axis direction, by comparing a signal voltage corresponding to an analog pixel signal output from the unit pixel 3 of the image capturing unit 2 via the vertical signal line 13 with a ramp wave supplied from the ramp unit 19. A comparison output of the voltage comparison unit 131, for example, has the low level when a ramp voltage is greater than a signal voltage, and has the high level when the ramp voltage is less than or equal to the signal voltage. The latch control unit 132 generates a control signal for controlling the latch unit 133 and the column counter 134 based on the comparison output of the voltage comparison unit 131.

The latch unit 133 includes the latch circuits D_0 to D_6 and the latch circuit D_7. The latch circuits D_0 to D_6 constituting the latch unit 133 are in the enable stat at a timing (second timing) at which the comparison output of the voltage comparison unit 131 is received and inverted. After a predetermined time has elapsed from the second timing (a third timing), the latch circuits D_0 to D_7 of the latch unit 133 are in the disable state and hence the logic state generated by the delay unit 18 is latched (held/stored). The column counter 134 performs a count operation based on an output of the latch circuit D_7 of the latch unit 133. Here, the column counter 134 is assumed to have a latch function that holds the logic state of the column counter 134.

Here, a lower-order data signal indicating the logic state of the latch unit 133, for example, is 8-bit data. In addition, a higher-order data signal indicating a count result of the column counter 134, for example, is 10-bit data. Further, 10 bits are just an example and a number of bits less than 10 bits (for example, 8 bits) or a number of bits greater than 10 bits (for example, 12 bits) may be used.

Next, an operation of this example will be described. Here, although the specific operation of the unit pixel 3 is omitted, the unit pixel 3 outputs a reset level and a signal level as is well known. The output reset level and signal level are output as a pixel output signal subjected to correlated double sampling (CDS) processing in the analog unit 6.

The ADC is performed as follows. For example, digital data corresponding to a pixel output signal is obtained by comparing the ramp wave falling at a predetermined slope with the pixel output signal and measuring a period from a point in time (a first timing) relating to the start of the comparison process to a point in time (the third timing) at which a predetermined time has elapsed from a point in time (the second timing) at which the pixel output signal has been consistent with the ramp voltage of the ramp wave using a count based on an output (for example, CK7, that is, corresponding to an output Q of the latch circuit D_7 of the latch unit 33 illustrated in FIG. 5) from the annular delay circuit and logic states of multi-phase clocks (CK0 to CK7, that is, corresponding to outputs Q of the latch circuits D_0 to D_7 of the latch unit 33 illustrated in FIG. 5) having a constant phase difference. Further, the ADC is performed by reading a reset level including noise of a pixel signal in a first read operation from each unit pixel 3 of a selection row of the image capturing unit 2. Next, the ADC is performed by reading a signal level in a second read operation. Thereafter, digital data corresponding to a pixel output signal may be obtained by digitally performing a CDS operation. The present invention is not limited thereto.

After a pixel output signal output from the unit pixel 3 of an arbitrary pixel row to the vertical signal line 13 has been stabilized, the control unit 20 supplies control data of ramp-wave generation to the ramp unit 19. The ramp unit 19 receiving the control data outputs a ramp wave that temporally changes in a ramp shape as a whole as a comparison voltage applied to one input terminal of the voltage comparison unit 131. The voltage comparison unit 131 starts a comparison of the ramp wave and the pixel output signal (the first timing). In addition, the control unit 20 changes a start pulse to be output to the annular delay circuit 8 from the low level to the high level at the first timing.

The voltage comparison unit 131 compares the ramp wave applied from the ramp unit 19 with the pixel output signal, and outputs a comparison output when two voltages are approximately consistent (the second timing). The comparison output is further inverted or delayed and output (the third timing). At the second timing, the latch circuits D_0 to D_6 of the latch unit 133 are in the enable state based on the comparison output of the voltage comparison unit 131. At the third timing, the latch circuits D_0 to D_7 of the latch unit 133 are in the disable state, and the logic state corresponding to the output from the delay unit 18 is latched. The latch circuit D_7 of the latch unit 133 is stopped and hence the column counter 134 latches a count value. Thereby, digital data (a data signal) corresponding to the pixel output signal is obtained. When a predetermined period has elapsed, the control unit 20 stops the supply of the control data to the ramp unit 19 and the output from the delay unit 18. Thereby, the ramp unit 19 stops the generation of the ramp wave.

Thereafter, digital data is output by the horizontal selection unit 14 via the horizontal signal line 117, and is transferred to the calculation unit 17. In the calculation unit 17, binary data is obtained by performing a binary process. Further, the calculation unit 17 may be configured to be embedded in the column processing unit 15.

Because the latch circuits D_0 to D_6 operate in only a period from the second timing to the third timing in the above-described operation, it is possible to reduce current consumption in the latch unit 33. Therefore, it is possible to reduce current consumption of an AD converter and current consumption of a solid state image pickup device.

Further, although a configuration implementing low power consumption by controlling operations of the latch circuits D_0 to D_6 constituting the latch unit 133 is made in this example, for example, a configuration may be made to control the latch circuits D_1 to D_5. In addition, the present invention is not limited thereto.

While preferred embodiments of the present invention have been described and illustrated above, it should be understood that these are examples of the present invention and are not to be considered as limiting. Additions, omissions, substitutions, and other modifications can be made without departing from the scope of the present invention.

According to the present invention, it is possible to provide a time detection circuit, an AD converter, and a solid state image pickup device in which current consumption has been reduced by shortening an operation time of a latch unit.

What is claimed is:

1. An analog-to-digital (AD) converter comprising:
a time detection circuit;
a reference signal generation unit configured to generate a reference signal; and
a calculation unit configured to generate a digital signal based on logic states latched in a latch unit and a state latched by a count latch unit,
wherein the time detection circuit comprises:
a delay unit configured to have a plurality of delay units, each of which delays and outputs an input signal, and start an operation at a first timing relating to an input of a first pulse;
the latch unit configured to latch the logic states of the plurality of delay units;
a count unit configured to perform a count operation based on a clock output from one of the plurality of delay units;
the count latch unit configured to latch the state of the count unit;
a latch control unit configured to enable the latch unit at a second timing relating to an input of a second pulse and cause the latch unit and the count latch unit to execute a latch at a third timing at which a predetermined time has elapsed from the second timing; and
a comparison unit configured to receive a predetermined analog signal and the reference signal that increases or decreases with the passage of time and output a comparison signal when the reference signal has satisfied a predetermined condition with respect to the analog signal,
the comparison signal is input to the latch control unit,
the first timing relates to a timing at which the analog signal is input to the comparison unit, and
the second timing relates to a timing at which the comparison signal is input to the latch control unit.

2. The AD converter according to claim 1, wherein the delay unit is an annular delay circuit in which the plurality of delay units are connected in an annular shape.

3. A solid state image pickup device comprising:
an image capturing unit in which a plurality of pixels, each of which outputs a pixel signal according to an amount of an incident electromagnetic wave, are arranged; and
an AD converter configured to receive an analog signal corresponding to the pixel signal, wherein
the AD converter comprises:
a time detection circuit;
a reference signal generation unit configured to generate a reference signal; and
a calculation unit configured to generate a digital signal based on logic states latched in a latch unit and a state latched by a count latch unit,
the time detection circuit comprises:
a delay unit configured to have a plurality of delay units, each of which delays and outputs an input signal, and start an operation at a first timing relating to an input of a first pulse;
the latch unit configured to latch the logic states of the plurality of delay units;
a count unit configured to perform a count operation based on a clock output from one of the plurality of delay units;
the count latch unit configured to latch the state of the count unit;
a latch control unit configured to enable the latch unit at a second timing relating to an input of a second pulse and cause the latch unit and the count latch unit to execute a latch at a third timing at which a predetermined time has elapsed from the second timing; and
a comparison unit configured to receive a predetermined analog signal and the reference signal that increases or decreases with the passage of time and output a comparison signal when the reference signal has satisfied a predetermined condition with respect to the analog signal,
the comparison signal is input to the latch control unit,
the first timing relates to a timing at which the analog signal is input to the comparison unit,
the second timing relates to a timing at which the comparison signal is input to the latch control unit, and
the comparison unit, the latch unit, the count unit, the count latch unit, and the latch control unit are provided for every one or more columns of the pixels constituting the image capturing unit.

4. The solid state image pickup device according to claim 3, wherein the delay unit is an annular delay circuit in which the plurality of delay units are connected in an annular shape.

5. A time detection circuit comprising:
a delay unit configured to have a plurality of delay units, each of which delays and outputs an input signal, and start an operation at a first timing relating to an input of a first pulse;
a latch unit configured to latch logic states of the plurality of delay units;
a count unit configured to perform a count operation based on a clock output from one of the plurality of delay units; and
a latch control unit configured to set the latch unit from a disable state, at which latching is invalid, to an enable state, at which latching is valid, at a second timing relating to an input of a second pulse and cause the latch unit to execute a latch at a third timing at which a predetermined time has elapsed from the second timing.

6. The time detection circuit according to claim 5, wherein the delay unit is an annular delay circuit in which the plurality of delay units are connected in an annular shape.

7. A time detection circuit comprising:
a delay unit configured to have a plurality of delay units, each of which delays and outputs an input signal and start an operation at a first timing relating to an input of a first pulse;
a latch unit configured to latch logic states of the plurality of delay units;
a count unit configured to perform a count operation based on a clock output from one of the plurality of delay units;
a latch control unit configured to enable the latch unit at a second timing, relating to an input of a second pulse and cause the latch unit to execute a latch at a third timing at which a redetermined time has elapsed from the second timing; and
a comparison unit configured to receive an analog signal and a reference signal that increases or decreases with the passage of time and output a comparison signal when the reference signal has satisfied a predetermined condition with respect to the analog signal,
wherein the comparison signal is input to the latch control unit,
the first timing relates to a timing at which the analog signal is input to the comparison unit, and
the second timing relates to a timing at which the comparison signal is input to the latch control unit.

8. The time detection circuit according to claim 7, wherein the delay unit is an annular delay circuit in which the plurality of delay units are connected in an annular shape.

9. An analog-to-digital (AD) converter comprising:
a time detection circuit;
a reference signal generation unit configured to generate a reference signal; and
a calculation unit configured to generate a digital signal based on logic states latched in a latch unit and a state latched by a count unit,
wherein the time detection circuit comprises:
  a delay unit configured to have a plurality of delay units, each of which delays and outputs an input signal, and start an operation at a first timing relating to an input of a first pulse;
  the latch unit configured to latch the logic states of the plurality of delay units;
  a count unit configured to perform a count operation based on a clock output from one of the plurality of delay units;
  a latch control unit configured to enable the latch unit at a second timing relating to an input of a second pulse and cause the latch unit to execute a latch at a third timing at which a predetermined time has elapsed from the second timing; and
  a comparison unit configured to receive a predetermined analog signal and the reference signal that increases or decreases with the passage of time and output a comparison signal when the reference signal has satisfied a predetermined condition with respect to the analog signal,
the comparison signal is input to the latch control unit,
the first timing relates to a timing at which the analog signal is input to the comparison unit, and
the second timing relates to a timing at which the comparison signal is input to the latch control unit.

10. The AD converter according to claim 9, wherein the delay unit is an annular delay circuit in which the plurality of delay units are connected in an annular shape.

11. A solid state image pickup device comprising:
an image capturing unit in which a plurality of pixels, each of which outputs a pixel signal according to an amount of an incident electromagnetic wave, are arranged; and
an AD converter configured to receive an analog signal corresponding to the pixel signal, wherein
the AD converter comprises:
  a time detection circuit;
  a reference signal generation unit configured to generate a reference signal; and
  a calculation unit configured to generate a digital signal based on logic states latched in a latch unit and a state latched by a count unit,
the time detection circuit comprises:
  a delay unit configured to have a plurality of delay units, each of which delays and outputs an input signal, and start an operation at a first timing relating to an input of a first pulse;
  the latch unit configured to latch the logic states of the plurality of delay units;
  a count unit configured to perform a count operation based on a clock output from one of the plurality of delay units;
  a latch control unit configured to enable the latch unit at a second timing relating to an input of a second pulse and cause the latch unit to execute a latch at a third timing at which a predetermined time has elapsed from the second timing; and
  a comparison unit configured to receive a predetermined analog signal and the reference signal that increases or decreases with the passage of time and output a comparison signal when the reference signal has satisfied a predetermined condition with respect to the analog signal,
the comparison signal is input to the latch control unit,
the first timing relates to a timing at which the analog signal is input to the comparison unit,
the second timing relates to a timing at which the comparison signal is input to the latch control unit, and
the comparison unit, the latch unit, the count unit, and the latch control unit are provided for every one or more columns of the pixels constituting the image capturing unit.

12. The solid state image pickup device according to claim 11, wherein the delay unit is an annular delay circuit in which the plurality of delay units are connected in an annular shape.

13. The time detection circuit according to claim 7, further comprising:
  a count latch unit configured to latch a state of the count unit, and
  wherein the latch control unit is configured to enable the latch unit at the second timing relating to the input of the second pulse and cause the latch unit and the count latch unit to execute the latch at the third timing at which the predetermined time has elapsed from the second timing.

14. The time detection circuit according to claim 5, wherein the delay unit is an annular delay circuit in which the plurality of delay units are connected in an annular shape.

15. The time detection circuit according to claim 5, further comprising:
  a comparison unit configured to receive an analog signal and a reference signal that increases or decreases with the passage of time and output a comparison signal when the reference signal has satisfied a predetermined condition with respect to the analog signal,
  wherein the comparison signal is input to the latch control unit,
  the first timing relates to a timing at which the analog signal is input to the comparison unit, and
  the second timing relates to a timing at which the comparison signal is input to the latch control unit.

16. The time detection circuit according to claim 15, wherein the delay unit is an annular delay circuit in which the plurality of delay units are connected in an annular shape.

17. The time detection circuit according to claim 5, further comprising:
  a count latch unit configured to latch a state of the count unit, and
  wherein the latch control unit is configured to enable the latch unit at the second timing relating to the input of the second pulse and cause the latch unit and the count latch unit to execute the latch at the third timing at which the predetermined time has elapsed from the second timing.

* * * * *